Figure 1A:
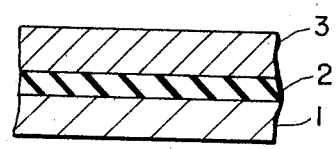

United States Patent [19]

Hasegawa et al.

[11] 4,321,104
[45] Mar. 23, 1982

[54] PHOTOETCHING METHOD

[75] Inventors: Norio Hasegawa, Hinodemachi; Naoki Yamamoto, Kawaguchi; Hiroshi Yanazawa, Hinodemachi, all of Japan

[73] Assignee: Hitachi, Ltd., Tokyo, Japan

[21] Appl. No.: 157,852

[22] Filed: Jun. 9, 1980

[30] Foreign Application Priority Data

Jun. 18, 1979 [JP] Japan ................................ 54-75714

[51] Int. Cl.³ ...................... H01L 21/306; C23F 1/02
[52] U.S. Cl. ...................................... 156/643; 29/580;
156/646; 156/656; 156/657; 156/659.1; 357/67;
427/88; 430/313; 430/315; 430/318
[58] Field of Search ...................... 357/65, 67, 68, 71;
427/88–90; 29/580, 590, 591; 156/643, 646,
652, 657, 656, 662, 659.1, 661.1, 665;
430/311–316, 318, 319, 323, 329; 148/178, 187

[56] References Cited

U.S. PATENT DOCUMENTS 3,609,470 9/1971 Kuiper ............................. 29/589 X
3,881,971 5/1975 Greer et al. ...................... 427/90 X
4,062,720 12/1977 Alcorn et al. ..................... 156/643

Primary Examiner—William A. Powell
Attorney, Agent, or Firm—Craig and Antonelli

[57] ABSTRACT

In forming an interconnection pattern on a silicon substrate, an Al-Si alloy is used as an interconnection material, a silicon film is deposited on the Al-Si alloy film, and a photoresist layer is applied and thereafter exposed to light to provide a photoresist pattern to serve as a mask for subsequent etching of the Al-Si alloy film.

Thus, the generation of standing waves due to reflection at the exposure is prevented, a microscopic interconnection pattern is precisely formed, and neither the junction-through due to a heat treatment nor a degradation in the bonding characteristics occurs.

6 Claims, 7 Drawing Figures

PHOTOETCHING METHOD

This invention relates to a photoetching method, and more particularly to a photoetching method which can form, for example, microscopic interconnections of semiconductor devices without degrading the bonding characteristics of such interconnections.

As is well known, aluminum is most extensively employed as an interconnection material for various semiconductors. The reasons for using aluminum are a high conductivity, a low cost, a low boiling point that allows a thin film to be readily formed by the vacuum evaporation, an easy etching, etc. An interconnection employing aluminum is usually formed by the technique of photolithography as described below.

An aluminum film is deposited by the vacuum evaporation on the whole area of the surface of a silicon substrate, an insulating film or the like on which the interconnection is to be formed, and a photoresist film is further deposited thereon. The photoresist film has its desired parts exposed to light through an expedient such as the use of a mask for exposure, and is thereafter developed to form a resist pattern. Using the resist pattern as a mask, the exposed parts of the aluminum film are removed by a dry or a wet etching process. Lastly, the resist pattern is removed. Then, the interconnection having a desired pattern is formed.

However, when the interconnection of a semiconductor device or the like is formed of aluminum, problems as stated below occur.

When an alloying treatment is carried out by heating in order to establish the electrical contact between the aluminum and the silicon substrate, the aluminum permeates into the silicon substrate due to the solid-phase diffusion reaction between the silicon substrate and the aluminum. In case where a diffused layer within the silicon substrate is thin, the aluminum having permeated penetrates through the diffused layer easily and gives rise to a junction short. Moreover, the cross-sectional area of the aluminum interconnection diminishes, so that electromigration is liable to occur.

Aluminum has a high reflectivity to light. Therefore, when it is overlaid with a photoresist film and then irradiated with ultraviolet rays, standing waves are generated within the photoresist film by reflected light from the aluminum film. As a result, the sharpness of the pattern to be obtained lowers drastically, which renders it difficult to accurately form the microscopic interconnection pattern.

In order to solve such problems, there has been proposed a method wherein a silicon film is deposited on the whole area of an aluminum film, the silicon film and the aluminum film are selectively removed by photoetching, to form a pattern, and the resultant structure is thereafter heated (Japanese Patent Application Laid-open Specification No. 49-84788).

With this method, owing to the heating after the formation of the pattern, the silicon film overlying the aluminum film is thermally diffused into the aluminum film, and the solid solubility limit of silicon within aluminum is fulfilled, so that the aluminum does not enter the silicon substrate. In addition, the reflection at the exposure to light is reduced.

In order to satisfy the solid solubility limit of silicon in aluminum, however, the thickness of the silicon film deposited on the aluminum film needs to be at least 100 nm. When such a thick silicon film is deposited and then heated, the density of silicon in the surface of the aluminum film becomes remarkably high even after completing the thermal diffusion. As a result, in bonding the interconnection (at a later stage of the manufacture of the semi-conductor device), a very inferior bonding takes place.

In order to prevent such degradation of the bonding characteristics, the thickness of the silicon film to be deposited on the aluminum film may be reduced so as to lower the silicon density in the surface of the aluminum film.

With the thin silicon film, however, the silicon film is fully diffused into the aluminum film by a baking (at 100°–300° C.) before the application of photoresist for enhancing the adherence of the photoresist film and a prebaking (at 100°–300° C.) of the photoresist film before the exposure to light, so that the silicon film does not serve for the prevention of the reflection at the exposure to light.

In case where any defect has arisen in the process of the photoetching, the application of the photoresist film and the subsequent steps are carried out again. In this case, the removal of the defective photoresist film is ordinarily performed by oxygen-plasma etching. When the silicon film is thin, it is entirely diffused into the aluminum film on account of a temperature rise at this stage and does not serve for the prevention of the reflection, either.

On the other hand, to the end of preventing the diffusion of aluminum into a silicon substrate, there has been proposed a method wherein an interconnection is formed by employing instead of aluminum an Al-Si alloy which contains silicon to the extent of 2 weight-% (U.S. Pat. No. 3,382,568).

The Al-Si alloy, however, has a reflectivity to ultraviolet rays as high as 50–95%. Therefore, when it is overlaid with a photoresist film and the resultant structure is irradiated with ultraviolet rays, standing waves appear and these waves make it very difficult to accurately form a microscope pattern.

An object of this invention is to solve the problems of the prior art and to provide a photoetching method which can prevent reflection at exposure to light and precisely form a microscopic interconnection without degrading the bonding characteristics of the interconnection.

In order to accomplish the object, this invention forms an interconnection by employing an Al-Si alloy as the material for the interconnection and depositing a thin silicon film thereon.

Figure 1B:
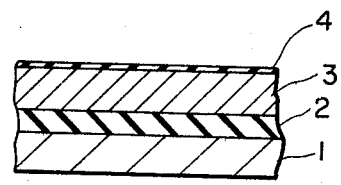
Figure 1C:
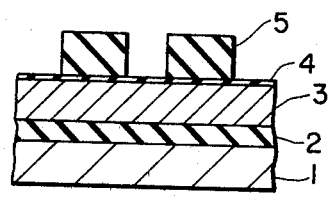
Figure 1D:
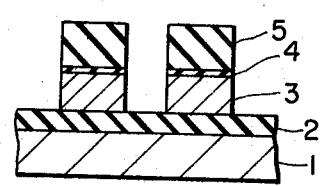
Figure 1E:
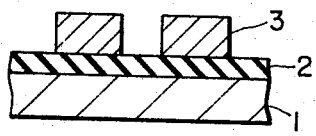
Figure 2A:
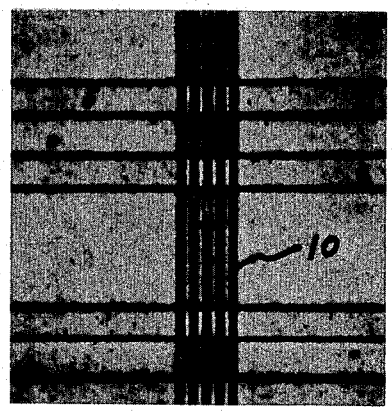
Figure 2B:
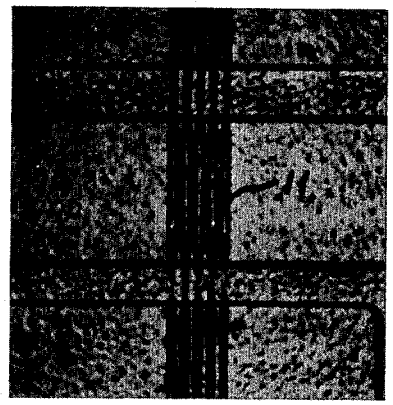

FIGS. 1(a) through 1(e) provide a flow chart showing one embodiment of this invention; and FIGS. 2(a) and 2(b) show microphotographs illustrative of an effect of this invention.

The invention will be described in detail in connection with the following embodiments, wherein:

In FIGS. 1(a) to 1(e) the various stages or steps that are followed by an embodiment of this invention are illustrated. Although FIGS. 1(a)–1(e) illustrate a part of a device in which an interconnection is formed on an insulating film, it will be appreciated that the interconnection is in direct contact with a silicon substrate in some other parts of the device.

First, as shown in FIG. 1(a), an SiO$_2$ film 2 having a thickness of approximately 500 nm is deposited on a silicon substrate 1 by a conventional process such as thermal oxidation, and an Al-Si alloy film 3 having a thickness of 800 nm is deposited on the SiO$_2$ film by the vacuum evaporation usually employed. Preferably, the quantity of silicon to be contained in the Al-Si alloy film 3 is 1.0–3.0% by weight which is the solid solubility limit at a heating temperature used for forming a contact. This Al-Si alloy film can be very easily formed in a manner similar to that of an aluminum film by the use of an Al-Si alloy containing 1.0–3.0% by weight of silicon and through the conventional vacuum evaporation.

As shown in FIG. 1(b), a silicon film 4 having a thickness of 50 nm is deposited by a conventional process such as evaporation and sputtering. This silicon film 4 is a reflection reducing film for preventing the reflection of ultraviolet rays by the surface of the Al-Si alloy film 3 during the step of exposing it to light. Accordingly, it is only required to be capable of preventing the reflection of the projected light, and it does not need to be very thick and it will suffice if a thickness of approximately 20 nm or more is provided.

Before applying photoresist, the substrate is baked at 200° C. for 20 minutes. The photoresist ("AZ1350J" produced by Shipley Inc.) is applied onto the whole surface of the substrate, and is prebaked at about 100° C. for 10 minutes. Thereafter, exposure and development are carried out in accordance with a conventional method. Then, a photoresist pattern 5 shown in FIG. 1(c) is formed. In this case, the silicon film 4 functions effectively as the reflection reducing film. By way of example, it has been found that the reflectivity to ultraviolet rays of the Al-Si alloy film 3 which had been approximately 50–95% was lowered to approximately 10% owing to the silicon film 4. Regarding the silicon film 4 to be deposited on the Al-Si alloy film 3, both a polycrystalline film and an amorphous film were effective.

Using as a mask the photoresist pattern 5 thus formed, exposed parts of the silicon film 4 and the Al-Si alloy film 3 are etched and removed as shown in FIG. 1(d). The etching in this case may well rely on a wet type chemical etching process employing an etchant, but the use of the reactive sputter etching process is more favorable because etching at a higher fidelity is possible. Reactive sputter etching can be executed without hindrance by the use of a known "parallel-plate" plasma reactor described in, for example, T. O. Herdon et al., "Plasma Etching of Aluminum", *Kodak Microelectronics Seminar Proceedings,* Interface 1977, pages 33–41.

After removing the photoresist pattern 5 with a conventional process, the silicon film 4 is removed. Then, the interconnection pattern 3 made of the Al-Si alloy film is formed as illustrated in FIG. 1(e). Although the removal of the silicon film 4 may employ the wet type chemical etching procedure employing an HF-HNO$_3$-based etchant, it is preferable to use the plasma etching procedure in which the atmosphere is a gas containing freon or a reactive sputter etching.

When the silicon film 4 is made thin, it does not always need to be removed by etching or the like after the Al-Si alloy film 3 has been etched. In such case, after having etched the Al-Si alloy film 3, the substrate may be heated at about 350° to 500° C. for 10 minutes or longer so as to diffuse silicon into the Al-Si alloy film. Even with this measure, insofar as the silicon film 4 is thin, the quantity of silicon to enter the Al-Si alloy film 3 is slight, and a layer containing excess silicon is not formed in the surface. Therefore, it is not feared that the bonding characteristics will degrade.

As apparent from the above description, according to this invention, the silicon film deposited on the Al-Si alloy film reduces sharply the reflection of ultraviolet rays at the exposure, and hence, the resolution of the photoetching is enhanced, so that a very good pattern is formed.

More specifically, in FIG. 2(a) a microphotograph of a photoresist pattern which was obtained by this invention is shown. It is clearly recognized that resist patterns 10 each having a width of 1 μm were formed at intervals of 1 μm in a very good condition, and that even when a convex part existed in the underlying layer, a disconnection or the like did not occur and that no hindrance was incurred. On the other hand, in FIG. 2(b) a case where a photoresist film of the same type as used in FIG. 1 (d) was deposited directly on an Al-Si alloy film without depositing a silicon film on the Al-Si alloy film and where photoresist patterns each having a width of 1 μm were formed at intervals of 1 μm.

As apparent of FIG. 2(b) the photoresist patterns 11 formed without depositing the silicon film underwent a contact between the adjacent patterns and a disconnection on a convex part or at a stepped part. It is needless to say that such photoresist patterns cannot be put into practical use, and the remarkable effectiveness of the reflection reducing film upon exposure is clear. After a photoresist film has been applied onto the surface of a material to-be-etched, e.g. silicon, a heat treatment at temperatures of about 100°–300° C. is usually performed before exposure to light in order to increase the adhesion between the photoresist film and the material surface and the strength of the photoresist film.

This heat treatment is called "prebaking". When a silicon film, deposited on aluminum, is thin, it becomes useless as a reflection reducing film because silicon is diffused into the aluminum by prebaking. Therefore, the silicon film cannot be made very thin.

In order for the silicon film to effectively function as the reflection reducing film when aluminum is used for a film for an interconnection, the thickness of the silicon film deposited on the aluminum needs to be approximately 100 nm or above. With such a thick silicon film, however, the silicon is not completely diffused even by a heat treatment for alloying to be executed later, and a layer having a very high content of silicon is formed in the surface. The presence of such surface layer renders the bonding characteristics very inferior, and renders the aluminum film unfeasible as the interconnection.

That is, when aluminum is used as the material of the interconnection and has the silicon film deposited thereon, it is very difficult to successfully perform both the prevention of the light reflection upon exposure and bonding for the formation of the interconnection. Even when the thickness of the silicon film is varied, prevention of the reflection and proper bonding characteristics cannot both be achieved.

In contrast, according to this invention, the silicon film is deposited on the Al-Si alloy film, and hence, the diffusion of the silicon film into the Al-Si alloy film does not take place due to the heat treatment at approximately 100°–300° C. in the prebaking. Therefore, the silicon film deposited on the surface of the Al-Si alloy film does not disappear due to the prebaking and functions effectively as a reflection reducing film.

Since the silicon film to be deposited for the prevention of the reflection is not found to diffuse due to prebaking, this silicon film may be thin. It is sufficient to provide a film thickness of approximately 20 nm or greater, but not more than 100 nm. Owing to this thin silicon film, when after placing the silicon film and the Al-Si alloy film into a desired shape by the photoetching, a heat treatment at approximately 400° C. is carried out in order to alloy the contact area between the interconnection and the substrate and to enhance the adherence of the interconnection with the substrate, the silicon film is completely diffused into the Al-Si alloy film. Therefore, any film containing silicon in a large quantity is not formed in the surface of the interconnection, and the bonding can be carried out without hindrance.

It is to be understood that, for these reasons, this invention is much more excellent than the prior art method wherein the silicon film is deposited on the aluminum film or wherein the Al-Si alloy film is used alone.

In this invention, it is a matter of course that the silicon film may be completely removed by etching after having formed the interconnection pattern. Since the silicon film for use in this invention may be very thin as described above, it can be very easily removed even with the etching.

To the end of lowering the reflectivity to ultraviolet rays during an exposure step, it has been proposed in the production of a magnetic bubble memory device to deposit a chromium oxide film on a permalloy film and to form a permalloy pattern by the use of the ion milling.

In this invention, when such chromium oxide film is employed as the reflection reducing film instead of the silicon film, the chromium oxide film needs to be perfectly removed after the projection of the light in order to prevent the bonding characteristics from degrading. However, the perfect removal of the chromium oxide is difficult. Therefore, not only the degradation of the bonding characteristics is inevitable, but also the characteristics of the semiconductor device are believed to be adversely affected in various respects by the remaining chromium. For these reasons, it is unfavorable to use the chromium oxide film as the reflection reducing film in the present invention.

In contrast to the chromium oxide film, the silicon film in this invention can be formed very easily by the vacuum evaporation. Moreover, since the silicon film may be very thin, it does not always need to be removed by etching after having formed the interconnection pattern, and it may be heated to approximately 400° C. so as to be diffused into the interconnection pattern. Thus, the manufacturing process becomes very simple, and the possible degradation of the bonding characteristics is not considered because the quantity of silicon to be diffused into the interconnection pattern is very small owing to the thinness of the silicon film. It is apparent that even when silicon remains to some extent, it has no influence on the characteristics of the semiconductor device unlike heavy metals such as chromium. This invention, therefore, is more excellent than the various methods having hitherto been proposed.

In this invention, the silicon content of the Al-Si alloy film should preferably be approximately 1.0–3.0 weight- %. When the silicon content is less than 1.0%, the diffusion of aluminum into the substrate and the junction-through ascribable thereto occur. When it is more than 3.0% by weight, phenomena unfavorable for the interconnection such as an increase in the electric resistance and the appearance of cracks are liable to occur.

The thickness of the interconnection pattern is approximately 400 nm–1.5 $\mu$m in case of ordinary semiconductor integrated circuits and large-scale integrated circuits. According to this invention, interconnections each having a width of 1 $\mu$m and spaced at intervals of 1 $\mu$m could be formed without hindrance by the use of Al-Si alloy films which had thicknesses within the aforementioned range.

Since the silicon film to overlie the Al-Si alloy film is deposited for the prevention of the reflection, it does not need to have a great thickness and a thickness of or above approximately 20 nm suffices as described before. When the silicon film is too thick (i.e., if it exceeds approximately 100 nm), it becomes difficult of being fully diffused even when heated to about 400° C. after the formation of the interconnection pattern, and hence, it is preferable to avoid making the thickness above 100 nm. If the thickness lies within a range 20–100 nm, the formation of the interconnection pattern and the subsequent bonding are not hindered, and an excellent interconnection is formed.

What is claimed is:
1. A photoetching method comprising:
   (a) stacking and depositing, in succession, an Al-Si alloy film having a thickness of approximately 400 nm to 1.5 $\mu$m, a silicon film having a thickness of approximately 10 to 100 nm and a photoresist film on a surface of a substrate or film on which a pattern is to be formed;
   (b) exposing desired parts of said photoresist film to light and thereafter developing said photoresist film to form a photoresist pattern;
   (c) etching and removing exposed parts of said silicon film and the underlying Al-Si alloy film by employing said photoresist pattern as a mask; and
   (d) removing said photoresist pattern to provide an interconnection pattern of said Al-Si alloy film.
2. A photoetching method according to claim 1, wherein the content of silicon in said Al-Si alloy film is approximately 1.0 to 3.0% by weight.
3. A photoetching method according to claim 1, wherein the remaining parts of the silicon film are heated at about 350° to 500° C. for at least 10 minutes to diffuse the silicon into the Al-Si alloy film.
4. A photoetching method according to claim 1, wherein the photoresist pattern was formed to provide an interconnection pattern wherein portions of the Al-Si film have widths of 1 $\mu$m and intervals of 1 $\mu$m.
5. A photoetching method according to claim 1, wherein the remaining parts of the silicon film are removed by plasma etching.
6. A photoetching method according to claim 1, wherein the remaining parts of the silicon film are heated to an elevated temperature to diffuse the silicon onto the Al-Si alloy film.

* * * * *